United States Patent
Pujari et al.

(10) Patent No.: US 12,278,022 B2
(45) Date of Patent: Apr. 15, 2025

(54) STRETCHABLE INTERCONNECTS FOR FLEXIBLE ELECTRONIC SURFACES

(71) Applicant: Alpha Assembly Solutions Inc., Waterbury, CT (US)

(72) Inventors: Narahari Pujari, Waterbury, CT (US); Bawa Singh, Waterbury, CT (US); Ravi Bhatkal, Waterbury, CT (US); Siuli Sarkar, Waterbury, CT (US); Anubhav Rustogi, Waterbury, CT (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 0 days.

(21) Appl. No.: 18/376,896

(22) Filed: Oct. 5, 2023

(65) Prior Publication Data

US 2024/0029916 A1    Jan. 25, 2024

Related U.S. Application Data

(60) Division of application No. 17/382,980, filed on Jul. 22, 2021, now Pat. No. 11,830,640, which is a continuation of application No. 16/887,455, filed on May 29, 2020, now Pat. No. 11,139,089, which is a division of application No. 15/326,224, filed as application No. PCT/GB2015/052024 on Jul. 14, 2015, now Pat. No. 10,672,531.

(60) Provisional application No. 62/027,303, filed on Jul. 22, 2014.

(51) Int. Cl.

| | |
|---|---|
| *H01B 1/22* | (2006.01) |
| *B22F 1/052* | (2022.01) |
| *B22F 1/068* | (2022.01) |
| *B22F 1/107* | (2022.01) |
| *B22F 1/17* | (2022.01) |
| *B23K 35/02* | (2006.01) |
| *B23K 35/30* | (2006.01) |
| *B23K 35/36* | (2006.01) |
| *B23K 35/362* | (2006.01) |
| *H05K 1/09* | (2006.01) |
| *H05K 1/18* | (2006.01) |
| *H05K 3/12* | (2006.01) |

(52) U.S. Cl.
CPC ............. *H01B 1/22* (2013.01); *B22F 1/052* (2022.01); *B22F 1/068* (2022.01); *B22F 1/107* (2022.01); *B22F 1/17* (2022.01); *B23K 35/025* (2013.01); *B23K 35/3006* (2013.01); *B23K 35/3613* (2013.01); *B23K 35/362* (2013.01); *H05K 1/095* (2013.01); *H05K 3/1216* (2013.01); *H05K 3/1241* (2013.01); *B22F 2301/255* (2013.01); *B22F 2302/45* (2013.01); *B22F 2304/10* (2013.01); *H05K 1/189* (2013.01); *H05K 2201/0133* (2013.01); *H05K 2201/0203* (2013.01); *H05K 2201/0245* (2013.01); *H05K 2201/10106* (2013.01)

(58) Field of Classification Search
None
See application file for complete search history.

(56) References Cited

U.S. PATENT DOCUMENTS

| | | | |
|---|---|---|---|
| 3,796,786 A | 3/1974 | Koch et al. | |
| 4,425,263 A * | 1/1984 | Nazarenko | H01H 13/785 252/514 |
| 5,346,940 A | 9/1994 | Brassard et al. | |
| 5,433,893 A | 7/1995 | Jost et al. | |
| 5,656,215 A | 8/1997 | Eckardt | |
| 5,882,802 A | 3/1999 | Ostolski | |
| 7,488,434 B2 | 2/2009 | Kuo | |
| 2004/0127626 A1 | 7/2004 | Yoshiko et al. | |
| 2005/0057906 A1 | 3/2005 | Nakatani | |
| 2007/0246690 A1 | 10/2007 | Kuo | |
| 2008/0166543 A1 | 7/2008 | Zhuo | |
| 2009/0020733 A1 | 1/2009 | Hirakawa | |
| 2009/0220738 A1 | 9/2009 | Oka | |
| 2012/0062478 A1 | 3/2012 | Kim | |
| 2012/0273263 A1 | 11/2012 | Nagarajan et al. | |
| 2013/0056249 A1 | 3/2013 | Taguchi | |
| 2013/0146820 A1 | 6/2013 | Chiou | |
| 2014/0216544 A1 | 8/2014 | Nakahara | |
| 2014/0367883 A1 | 12/2014 | Hatakeyama | |
| 2015/0218391 A1 | 8/2015 | Takahashi | |
| 2015/0240099 A1 | 8/2015 | Chopra | |

FOREIGN PATENT DOCUMENTS

| | | |
|---|---|---|
| CN | 1269585 A | 10/2000 |
| CN | 101107678 A | 1/2008 |
| GB | 2277526 A | 11/1994 |
| JP | 2004106947 A | 4/2004 |
| JP | 5462984 B1 | 4/2014 |
| JP | 2014080555 A | 5/2014 |
| KR | 1020040058202 A | 7/2004 |
| KR | 1020040106947 A | 12/2004 |
| KR | 1020130013993 A | 2/2013 |
| KR | 1020140062777 A | 5/2014 |

(Continued)

OTHER PUBLICATIONS

Sigma Aldrich, 2-(2-ethoxyethoxy) ethyl acetate, Jun. 23, 2018 (2018).
Dynapol Technical Brochure, Jun. 23, 2018 (2018).

*Primary Examiner* — Christopher M Rodd
(74) *Attorney, Agent, or Firm* — Carmody Torrance Sandak & Hennessey LLP

(57) ABSTRACT

A conductive paste and method of manufacturing thereof. The conductive paste comprises conductive particles dispersed in an organic medium, the organic medium comprising: (a) a solvent; and (b) a binder comprising a polyester. The conductive paste typically comprises silver and may contain various other additives. A stretchable conductive layer can be formed by curing the conductive paste.

16 Claims, 6 Drawing Sheets

(56) References Cited

FOREIGN PATENT DOCUMENTS

| | | |
|---|---|---|
| TW | 20074178 A | 11/2007 |
| WO | 2013058168 A1 | 4/2013 |
| WO | 2013118848 A1 | 8/2013 |
| WO | 2014038611 A1 | 3/2014 |

* cited by examiner

STRETCHABLE INTERCONNECTS FOR FLEXIBLE ELECTRONIC SURFACES

FIELD OF THE INVENTION

The invention relates to a conductive paste and method of manufacturing thereof. The conductive paste may form a conductive coating, circuit wiring or interconnection capable of being stretched without substantial crack formation or substantial loss in electrical continuity, and may therefore find use in capacitive touch technologies and stretchable electronic surfaces. The solderable version of this paste can be used directly in joining two metal surfaces.

BACKGROUND OF THE INVENTION

Capacitive touchscreen displays, for example those present in smart phones, rely on the electrical properties of the human body to detect when and where on a display the user is touching. Because of this, capacitive displays can be controlled with very light touches of a finger and generally cannot be used with a mechanical stylus or a gloved hand. For a capacitive device, the capacitive screen is made of an insulating layer that can also be transparent, such as glass or plastic. If the insulating layer is transparent, then a thin trace of transparent conductive material is used to form electrical patterns on the inside of the insulating layer. When a user touches the monitor with his finger, some of the charge is transferred to the user, so the charge on the capacitive layer decreases. This decrease is measured in circuits located at each corner of the monitor. The computer calculates, from the relative differences in charge at each corner, exactly where the touch event took place and then relays that information to the touch-screen driver software.

Flexible electronics, also known as flexible circuits, result from assembling electronic circuits by mounting electronic devices on flexible substrates. The flexibility of the circuit is typically limited not only by the flexibility of the substrate, but also by the flexibility of the electronic devices, circuit lines and interconnections mounted on the substrate.

Conductive layers, circuit wiring and interconnections can be formed using a conductive paste, typically comprising conductive particles dispersed in an organic medium. Existing conductive pastes are not suitable for selective structuring at the micron-sized level, as required, for example, in microelectronics manufacture. In addition, such pastes do not exhibit adequate resistance to environmental effects such as, for example, extremes of temperature. Conventional conductive pastes may comprise an epoxy resin. In such pastes, the hardening agent is flaky and hard, a therefore the pastes are not suitable for manufacturing flexible circuits. The electrically conductive pastes are also prone to form a gel after being kept in storage for a long time. Other conventional polymeric pastes have the disadvantage of non-flexibility. As a result, a functional circuit made of conventional electrically conductive paste is likely to crack. Conventional conductive pastes, such as, for example, those containing silver nanoparticles or metal complex particles cannot typically be sintered at low temperature. Accordingly, when a circuit or conductive layer or interconnection is formed on a substrate using such conventional pastes, damage to the substrate may occur.

There is a need for a conductive paste capable of forming a flexible conductive layer, circuit wire and/or interconnection at low temperature, which is capable of being stretched without substantial crack formation or substantial loss in electrical continuity. There is also a need to make solderable flexible paste for applications such as, for example, decorative LED lighting.

The present invention seeks to tackle at least some of the problems associated with the prior art or at least to provide a commercially acceptable alternative solution thereto.

The present invention provides a conductive paste comprising conductive particles dispersed in an organic medium, the organic medium comprising:
a solvent; and
a binder comprising a polyester.

Each aspect or embodiment as defined herein may be combined with any other aspect(s) or embodiment(s) unless clearly indicated to the contrary. In particular, any features indicated as being preferred or advantageous may be combined with any other feature indicated as being preferred or advantageous.

BRIEF DESCRIPTION OF THE FIGURES

The invention will now be described with reference to the following non-limiting Figures, in which.

DETAILED DESCRIPTION OF THE PREFERRED EMBODIMENTS

Figure 1:
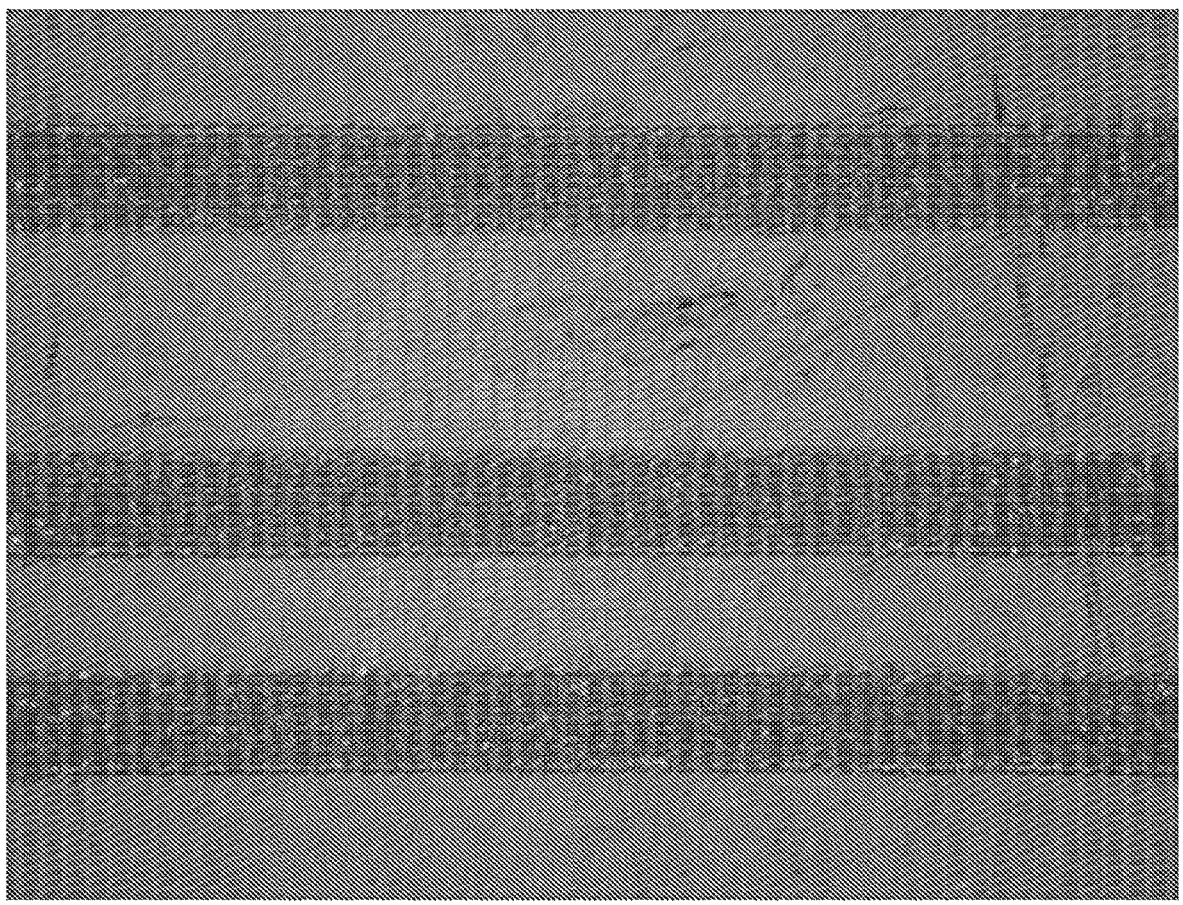
FIG. 1 shows lines of printed conductive paste according to the present invention.

The term "polyester" used herein may encompass a polymer that contains the ester functional group in its main chain.

The inventors have surprisingly found that the conductive paste of the present invention may form a conductive coating/layer, circuit wire or interconnection capable of being stretched (typically up to 150%) without substantial crack formation or substantial loss in electrical continuity. The conductive coating or interconnection may also exhibit excellent volume resistivity, typically of the order of $10^{-5}$ ohm-cm. In view of these properties, the conductive paste of the present invention may be used to fabricate low voltage circuitry, especially on flexible substrates. Accordingly, the conductive paste may be particularly suitable for use in capacitive touch technologies and stretchable electronic surfaces.

The conductive paste may be cured at low temperatures at a rapid rate, for example at 65° C. for 20 minutes, and may therefore be particularly suitable for use by manufacturers with limited curing capacity. The conductive paste may also be screen printable, stencil printable and/or jettable, and may be capable of continuous printing without flooding.

The conductive paste may exhibit excellent adhesion on substrates such as, for example, paper-phenolic resin boards, plastic boards (PMMA, PET or the like) and glass-epoxy resin boards. It is also stable at room temperature, typically for more than one year.

In comparison to prior art conductive pastes, the conductive paste of the present invention may exhibit improved compressive strength, diametral tensile strength and/or flexural strength. The conductive paste may be capable of being printed in very fine lines, for examples lines of 50 microns or less in width.

The conductive paste of the present invention may be thermoformable and/or cold drawable, and is suitable for use in 3D printing.

The conductive paste of the present invention may be used to form an electronic surface. Such electronic surfaces may be conformable skin-like structures with large surface area, high mechanical flexibility and even stretchability, and multifunctional capabilities. Such structures may enable electro-active surfaces of arbitrary shape wrapped over airplane wings, buildings, robots, three-dimensional (3-D) displays, and human medical prostheses. One of the most difficult challenges in the development of stretchable electronics is the simultaneous achievement of both excellent mechanical robustness and electronic performance. The conductive pastes can be used for a variety of applications including: LED lighting luminaire fabrication with integrated thermal and electrical interconnect at very low cost, strain absorbing interconnects for high thermal cycle fatigue resistance, robotic sensory skins and wearable communication devices and bio-integrated devices. The conductive pates can be used for high CTE mismatch applications such as, for example, direct chip on board heat sink die attach for LED.

Suitable conductive particles include, for example, particles of nickel, copper, carbon, iron, gold, platinum, palladium and mixtures and alloys thereof, as well as conductor coated materials such as organic polymer particles coated by silver, copper or nickel-silver alloy powder, silver-coated copper powder, silver-coated copper alloy powder, silver-coated copper and/or nickel powder and copper-coated silver powder. A conductive powder such as, for example, reduced silver powder, may also be used.

The conductive paste may act as a cold solder or a conductive adhesive. The paste forms electrical and thermal interconnects that are super elastic and compliant for a variety of applications (including: LED lighting luminaire LED assembly, 3-D in mould labelling etc.) with integrated thermal and electrical interconnect at very low cost. Further, the paste may be used as strain absorbing interconnects for high thermal cycle fatigue resistance, robotic sensory skins, wearable communication devices and bio-integrated devices. The conductive adhesives can be used for high CTE mismatch applications such as, for example, direct chip on board heat sink die attach for LED. The conductive adhesive may be used for PV ribbon attach to Si cells.

The conductive paste may be overprinted with any solder paste to make solderable silver paste. Until now it has been difficult to prepare solderable silver paste, since silver can easily leach or dissolve in the solder. In this approach, copper-coated silver particles are typically employed. Advantages of the silver paste include: (i) strong joints and excellent compatibility with different surface finishes, (ii) the proprietary formulation helps avoiding silver dissolution and makes joints strong, (iii) it is capable of excellent printing with no bleeding or granules, and (iv) components can be mounted easily, with no line breaks or silver dissolution.

The conductive particles preferably comprise silver. Silver may increase the conductivity of a conductive film formed using the conductive paste.

The conductive particles may be in the form of, for example, spheres, rods, flakes, plates and combinations of two or more thereof.

Preferably, the majority of the conductive particles comprise silver flakes having an aspect ratio (i.e. ratio of length to thickness) of five or less. This may enable fine line printing, for example print lines of about 50 micron or less in width. In this case, typically at least 90 wt. % of the conductive particles comprise silver flakes having an aspect ratio of five or less, more typically at least 95 wt. % of the conductive particles, even more typically substantially all of the conductive particles.

Preferably, the majority of the conductive particles have a largest dimension of from 0.5 to 50 microns, preferably from 1 to 20 microns. Such particle sizes may be measured, for example, using a particle size analyser. In this case, typically at least 90 wt. % of the conductive particles have a largest dimension in these ranges, more typically at least 95 wt. % of the conductive particles, even more typically substantially all of the conductive particles. Finer flakes have limitations in that when an electric field is applied under a high-temperature and high-humidity atmosphere, there takes place a phenomenon called migration and resulting electro deposition of silver between the wiring conductors and electrodes to cause short circuiting between the electrodes or the wires. Moreover, finer particles loose electrical contact under stretching or bending operation. With bigger flakes it is easy to make paste without use of a three roll mill.

The conductive paste preferably comprises from 30 to 80 wt. % conductive particles based on the total weight of the conductive paste, preferably from 55 to 75 wt. %, even more preferably about 65 wt. %. Higher levels of conductive particles may result in unfavourable rheological characteristics of the conductive paste and/or reduce the adhesiveness of the conductive paste. Lower levels of conductive particles may result in unfavourable levels of conductivity.

The solvent is preferably capable of completely dissolving the binder. For high Tg substrates, the solvent preferably may be vaporised from the composition below the thermal degradation temperature of the flexible substrate to which the conductive paste is to be applied. Examples of suitable solvents include, for example, aromatics, ketones, esters, cellosolves, alcohols, phenols, butyl carbitol, acetates, ethers and combinations of two or more thereof. The solvent is preferably a non-hydrocarbon polar solvent. In a preferred embodiment, the solvent comprises carbitol acetate.

The solvent preferably has a boiling point of from 150 to 300° C. Solvents having a boiling point below about 150° C. may thicken the composition excessively during screening as solvent is evaporated therefrom. This may result in plugging of the screens that are used for printing patterns of the material onto the substrate. Within this limitation, however, the volatility of the solvent will be selected in consideration of the method of solvent removal and/or fabrication. For example, when the high speed reel-to-reel procedure is used, it is essential that the solvent be removed quite rapidly during processing. Thus lower boiling point solvent must be used, such as those boiling from 150° to 175° C. On the other hand, when slower fabrication procedures are used, less volatile solvents may be used such as those boiling from 175 to 300° C., or from 175 to 240° C. In either case the solvent removal is ordinarily accelerated by mildly heating the printed substrate. Typically, the substrate is heated in a hot air oven to 70° to 90° C. when using more volatile solvents in the reel-to-reel process, and 90° to 120° C. when using less volatile solvents in the semiautomatic processes.

The conductive paste preferably comprises from 5 to 40 wt. % solvent based on the total weight of the conductive paste, more preferably from 20 to 30 wt. % solvent. Levels of solvent outside of these ranges may result in the conductive paste exhibiting undesirable rheological properties.

Preferably, the ratio of solvent to binder by weight is from 0.15 to 0.5. This may provide the paste with particularly favourable viscosity.

The polyester may advantageously be a thermosetting polymer or a thermoplastic polymer. The polyester preferably has a thermosetting and/or thermoplasting curing temperature as low as possible, more preferably less than or equal to 250° C., even more preferably from 30 to 100° C. Lower curing temperatures reduce the likelihood of damage to a work piece on which the conductive paste is cured.

The polyester may be linear or branched, and saturated or unsaturated.

The binder may comprise a plurality of polyesters.

The polyester may advantageously exhibit one or more of the following properties: a specific gravity of from about 1.0 to about 1.35; a viscosity of from about 800 to about 50000 cPs, elastomeric nature with excellent film forming characteristics; a softening point (R and B) of less than 100° C.

The polyester is preferably a copolyester. The term "copolyester" as used herein encompasses a polyester formed from comonomers. In comparison with conventional polyesters, copolyesters have a reduced tendency to crystallise. In some embodiments, a copolyester may be used in combination with an amorphous linear polyester. The polyester may be a natural polyester.

The copolyester is preferably saturated, linear and high molecular weight. In a preferred embodiment, the copolymer is formed by copolymerisation of an aromatic dicarboxylic acid (such as, for example, isophthalic acid or terephthalic acid) and an alkylene glycol (such as, for example, ethylene glycol or propylene glycol). Such copolymers may provide particularly enhanced flexibility and stretchability. A particularly advantageous copolyester in this regard is poly(ethylene isophthalate). In another preferred embodiment, the copolymer is a non-crystalline copolyester such as, for example, an ester of adipic acid and neopentyl glycol or an ester of adipic acid, neopentyl glycol and 1,6-hexane diol. Suitable commercial copolymers include, for example, the Dynapol series of esters, DIC's polyols polyester series copolyesters, Primaalloy from Mitsubishi, Vylon from Toyobo chemicals, Setal 173 VS60 and Setal 168 SS80 from Nuplex, Nippon hosei series polyester and the like.

The conductive paste preferably comprises from 0.1 to 35 wt. % binder based on the total weight of the composition, more preferably from 1 to 25 wt. % binder. Lower levels of binder may result in undesirable levels of flexibility and/or stretchability. Higher levels of binder may result in undesirable rheological characteristics and may reduce the paste's ability to be printable and/or jettable.

The binder preferably further comprises an elastomer. The presence of an elastomer may increase the stretchability and/or crack resistivity of the printed paste. The elastomer preferably comprises an acrylic polymer. The acrylic polymer may have carboxyl, hydroxyl, or amide groups, or a mixture of these, and preferably has a weight average molecular weight of 25000-500000 and a glass transition temperature of from −20° C. to +125° C. Acrylic polymers suitable for use in the present invention include, for example, alkyl methacrylate, alkyl acrylate, hydroxyalkyl acrylate, hydroxyalkyl methacrylate, and may be combined with styrene, acrylic acid or methacrylic acid. Preferred acrylic polymers include an alkyl methacrylate having from 1 to 18 carbon atoms in the alkyl group, an alkyl acrylate having from 1 to 18 carbon atoms in the alkyl group and a hydroxyalkyl acrylate or a hydroxyalkyl methacrylate each having 2-4 carbon atoms in the hydroxyalkyl group. The conductive paste preferably comprises from 0.1 to 20 wt. % elastomer, more preferably from 0.5 to 8 wt. % elastomer.

The binder preferably further comprises an amino resin. The presence of an amino resin may increase the stretchability and/or flexibility of the paste. The amino resin may act as a curing agent. The conductive paste preferably comprises from 0.1 to 20 wt. % amino resin, more preferably from 0.5 to 8 wt. % amino resin.

The conductive paste may further comprise a rheology modifier. The rheology modifier may be used to adjust the consistency and rheology of the paste to the particular method of application (e.g. screen printing, stencil printing, jetting). Particularly preferred rheology modifiers include, for example, isopropyl myristate ("IPM"), caprylic/capric triglyceride, ethyl oleate, triethyl citrate, dimethyl phthalate or benzyl benzoate, cellulose acetate phthalate, ethyl cellulose, hydroxypropylmethyl cellulose, cellulose acetate butyrate or cellulose triacetate, hydroxyethylcellulose ("HEC"), hydroxypropylcellulose, caboxymethylcellulose, polyethylene glycol or polyvinylpyrrolidone. Even more Illustrative viscosity modifiers include, but are not limited to, glycerol, glycols, stabilite, alkyl glycidyl ethers, ethyl cellulose, hydroxypropyl cellulose, butyl methacrylate, and feldspar. In the present invention the preferred rheology modifier is cellulose ester. Cellulose esters may provide improved hardness, improved silver flake orientation, high clarity, high gloss, decreased dry-to-touch time, improved flow and leveling, improved re-dissolve resistance, reduced cratering, and reduced blocking. Cellulose esters, particularly butyrated cellulose esters are alcohol soluble. Such species preferably have a butyryl content of about from 45 to 50% by weight and a hydroxyl content of about from 4 to 5% by weight. Commercial examples of alcohol soluble cellulose acetate butyrates suitable for use in the present invention are available commercially. The rheology modifier may be a natural polyester, This may provide stretchability and thermoformability to the silver paste. The conductive paste typically comprises from 0.1 to 20 wt. % rheology modifier based on the total weight of the conductive paste, more preferably from 0.5 to 8 wt. % rheology modifier based on the total weight of the conductive paste.

The conductive paste may further comprises a surface active agent. The presence of a surface active agent may increase the flexibility of the conductive paste. Suitable surface active agents for use in the present invention include, for example, dipate-based surface active agents, trimellitates, maleates, sebacates, benzoates, epoxidized vegetable oils, sulfonamides, organophosphates, glycols, polyethers and various ethylene oxide-propylene oxide (EO/PO) copolymers, tetrahydrofurfurylalcohol, bis(2-ethylhexyl) phthalate (DEHP), diisononyl phthalate (DINP), bis(n-butyl) phthalate (DnBP, DBP), butyl benzyl phthalate (BBzP), diisodecyl phthalate (DIDP), di-n-octyl phthalate (DOP or DnOP), diethyl phthalate (DEP), diisobutyl phthalate (DIBP), di-n-hexyl phthalate, dimethyl adipate (DMAD), monomethyl adipate (MMAD), dioctyl adipate (DOA), trimethyl trimellitate (TMTM), tri-(2-ethylhexyl) trimellitate (TEHTM-MG), tri-(n-octyl,n-decyl) trimellitate (ATM), tri-(heptyl,nonyl) trimellitate (LTM), n-octyl trimellitate (OTM), dibutyl maleate (DBM), diisobutyl maleate (DIBM), dibutyl sebacate (DBS), N-ethyl toluene sulfonamide (ortho and 5 para isomers), N-(2-hydroxypropyl) benzene sulfonamide (HP BSA), N-(n-butyl) benzene sulfonamide (BBSA-NBBS), tricresyl phosphate (TCP), tributyl phosphate (TBP), triethylene glycol dihexanoate (3G6, 3GH), tetraethylene glycol diheptanoate (4G7), nitrobenzene, carbon disulfide and P-naphthyl salicylate, triethyl citrate (TEC), acetyl triethyl citrate (ATEC), tributyl citrate (TBC) acetyl tributyl citrate (ATBC), trioctyl citrate (TOC), acetyl trioctyl citrate (ATOC), trihexyl citrate (THC), acetyl trihexyl citrate (ATHC), butyryl trihexyl citrate (BTHC, trihexyl o-butyryl citrate), trimethyl citrate (TMC), nitroglycerine (NG), butanetriol trinitrate (BTTN), metriol trinitrate (METN), diethylene glycol dinitrate (DEGN), bis(2,2-dinitropropyl)formal (BDNPF), bis(2,2-dinitropropyl)acetal (BDNPA), 2,2,2-Trinitroethyl 2-nitroxyethyl ether (THEN), sulfonated naphthalene formaldehyde based 15 materials, sulfonated melamine formaldehye based materials, polycarboxylic ethers, and dioctyl terephthalate 2,5-dimethyl-2,5 hexanediol (DOTP). The paste typically does not contain more than 3 wt. % surface active agent, for example from 0.1 to 3 wt. % surface active agent.

The paste may further comprises a silane monomer and/or slime oligomer. Such species may improve the wetting characteristics of the conductive paste and may increase adhesion of the conductive paste to a substrate. The silanes may include non-functional silanes and functionalized silanes including amino-functional, epoxy-functional, acrylate-functional and other functional silanes, which are known in the art. Exemplary functionalized silanes include r-glycidoxypropyl-trimethoxysilane, γ-glycidoxypropyltriethoxysilane, glycidoxypropyl-methyldiethoxysilane, glycidoxypropyltrimethoxysilane, glycidoxypropyltriethoxysilane, glycidoxypropylmethyldimethoxysilane, glycidoxypropylmethyldiethoxysilane, 5,6-epoxyhexyltriethoxysilane, epoxycyclohexylethyltrimethoxysilane, and the like. Other exemplary functionalized silanes include trimethoxysilylpropyldiethylene-triamine, N-methylaminopropyltrimethoxysilane, aminoethylaminopropylmethyldimethoxysilane, aminoethylaminopropyltrimethoxysilane, aminopropylmethyldimethoxysilane, aminopropyltrimethoxysilane, aminoethylaminoethylaminopropyltrimethoxysilane, N-methylamino-propyltrimethoxysilane, methylaminopropyltrimethoxysilane, aminopropylmethyldiethoxysilane, aminopropyltriethoxysilane, 4-aminobutyltriethoxysilane, oligomeric aminoalkylsilane, m-aminophenyltrimethoxysilane, phenylaminopropyltrimethoxysilane, aminoethylaminopropyltriethoxysilane, aminoethylaminoisobutylmethyldmethoxysilane, and the like. Additional exemplary functional silanes include (3-acryloxypropyl)-trimethoxysilane, gamma-methacryloxypropyltrimethoxysilane, gamma-mercapto-propyltriethoxysilane, and olefinic silanes, such as vinyltrialkoxysilane, vinyltriacetoxysilane, alkylvinyldialkoxysilane, allyltrialkoxysilane, hexenyltrialkoxysilane and the like. Polymers bearing silicon group such as but not limited to poly (methyl siloxane), poly (dimethyl siloxane) and like may be used. BYK307, BYK310, BYK311, hexamethylene disiloxane and the likes are particularly preferred silanes. If silane monomer and/or silane oligomer is present in the conductive paste, it typically does not exceed 5 wt. %, more typically it is present in an amount of from 0.1 to 3 wt. %.

The conductive paste may further comprise a conductive polymer. The presence of a conductive polymer may increase the conductivity of the conductive paste. Conductive polymers suitable for use in the present invention include, for example, poly(fluorenes), polyphenylenes, polypyrenes, polyazulenes, polynaphthalenes, polyaniline, polypyrrols, polycarbazoles, polyindoles, polyazepines, polythiophenes and poly(3,4-ethylenedioxy thiphenes) (PEDOT), poly(p-phenylene sulphide) (PSS), copolymer of PEDOT:PSS and the like.

The conductive paste may further comprise an inorganic filler. Inorganic fillers suitable for use in the present invention include, for example, quartz, graphene, graphene oxide, graphite, any suitable silver compound from the group consisting of silver acetate, silver carbonate, silver chlorate, silver chloride, silver lactate, silver nitrate, silver pertafluoropropionate, silver trifluoroacetate, silver trifluo romethanesulfonate, and a mixture thereof.

The conductive polymer and/or inorganic filler may be added directly or in solution. A preferred method is to add in the form of dispersion. Blending with the conductive composition without losing conductivity of the composition is critical. The concentration of the conductive polymer and/or inorganic filler therefore, plays critical role. Typically, from 1 to 40 wt. % of conductive polymer and/or inorganic filler may be added, preferably from 5 to 20 wt. %.

In a particularly preferred embodiment:
the conductive particles comprise silver;
the majority of the conductive particles have a largest dimension of from 0.5 to 50 microns;
the conductive paste comprises from 30 to 80 wt. % conductive particles based on the total weight of the conductive paste;
the polyester is poly(ethylene isophthalate); and
optionally the conductive paste comprises one or more of an elastomer, an amino resin, a rheology modifier, a surface active agent, a silane monomer and/or oligomer, a conductive polymer and an inorganic filler.

The poly(ethylene isophthalate) is advantageously linear, saturated and high molecular weight. The rheology modifier may be a natural polyester, This may provide stretchability and thermoformability to the silver paste.

In a further aspect, the present invention provides a conductive paste comprising conductive particles dispersed in an organic medium, the organic medium comprising:
a solvent; and
a binder comprising one or more of:
(a) a branched polyol ester,
(a) a saturated or unsaturated polyester,
(b) an amino resin,
(c) a copolyester derived from one or more glycols and/or dibasic acids,
(d) a polyurethane and/or polyurethane telechelics,
(e) an alkyd resin, and
(f) cellulose acetate and/or derivatives thereof.

The conductive paste may form a conductive coating capable of being stretched (typically up to 150%) without substantial crack formation or substantial loss in electrical continuity.

In a further aspect, the present invention provides a conductive paste comprising conductive particles dispersed in an organic medium, the organic medium comprising:
a solvent; and
a binder comprising a thermosetting polymer and/or thermoplastic polymer.

The conductive paste may form a conductive coating capable of being stretched (typically up to 150%) without substantial crack formation or substantial loss in electrical continuity.

The conductive particles preferably comprise copper-coated silver particles, more preferably copper-coated silver flakes. Such particles may restrict dissolution and migration of silver. This is particularly advantageous when the conductive paste is used as a solderable silver paste (see above). Typically, the majority of the outer surface of the silver particles are coated with copper, more typically substantially all of the outer surface of the silver particles are coated with copper, even more typically all of the outer surface of the silver particles is coated with copper.

In an alternative embodiment, the conductive particles may comprise silver-coated nickel particles and/or silver-coated tin particles. Such conductive particles may be beneficial when the conductive paste is used as a solderable silver paste. Typically, the majority of the outer surface of the nickel and/or tin particles are coated with silver, more typically substantially all of the outer surface of the nickel and/or tin particles are coated with silver, even more typically all of the outer surface of the nickel and/or tin particles is coated with silver.

Preferably, the conductive particles comprises carbon flakes, more preferably wherein the conductive paste is for overprinting a silver line. Paste made with carbon flakes can be used to overprint on a silver line. Such a paste may restrict silver migration and reduce costs.

The conductive paste may be dispensable to form a line with a resolution of 50 micron or more.

In a further aspect, the present invention provides a conductive adhesive or polymer solder comprising the conductive paste described herein.

In a further aspect, the present invention provides solderable paste for joining two or more work pieces, the solderable paste comprising:
the conductive paste described herein; and
a solder paste.

In a further aspect the present invention provides a method of manufacturing the conductive paste described herein, the method comprising:
providing a solvent, a binder and conductive particles;
combining the binder and the solvent to form an organic medium; and
dispersing the conductive particles in the organic medium.

In a further aspect the present invention provides a method of forming a stretchable conductive layer on a substrate, the method comprising:
providing a substrate;
applying the conductive paste as described herein to the substrate; and
curing the conductive paste.

The curing may be carried out by, for example, drying. Drying may at least partially remove solvent from the conductive paste.

The substrate may be a paper-phenolic resin board, a plastic board or a glass epoxy resin board. The substrate may itself be stretchable. The plastic board may comprise, for example, one or more of PMMA, PET and the like.

Applying the conductive paste to the substrate preferably comprises screen printing, stencil printing and/or jetting. Such techniques may advantageously allow automation of the method.

Curing the conductive paste is preferably carried out at a temperature of up to 250° C., more preferably from 30 to 120° C. Higher temperatures may result in damage to the substrate.

In a further aspect, the present invention provides a method of forming an interconnection between two work pieces to be joined, the method comprising:
providing two or more work pieces to be joined;
placing the conductive paste as described herein in the vicinity of the work pieces; and
curing the conductive paste.

The preferable features associated with the previous aspect of the present invention apply also to this aspect of the present invention. The resulting interconnections may advantageously be flexible. The two or more work pieces to be joined may be a circuit board and a circuit board component.

The present invention provides a method of forming a circuit board comprising:
providing a circuit board substrate and the conductive paste conductive paste described herein;
disposing the conductive paste on the circuit board substrate in a desired circuit pattern; and
curing the conductive paste.

The preferable features associated with the previous aspect of the present invention apply also to this aspect of the present invention. The circuit board substrate is preferably flexible.

In a further aspect, the present invention provides a method of forming a capacitive touchscreen panel, the method comprising:
providing a substrate;
applying the conductive paste described herein to the substrate; and
curing the conductive paste.

The preferable features associated with the previous aspect of the present invention apply also to this aspect of the present invention. The substrate is typically itself flexible. The method may further comprise fixing one or more conductors and/or circuits to the substrate, typically at the corners of the substrate.

In a further aspect, the present invention provides a capacitive touchscreen panel obtainable by the method described herein.

In a further aspect, the present invention provides a mobile telephone, laptop computer or tablet computer comprising the capacitive touchscreen panel described herein.

In a further aspect, the present invention provides an electronic surface produced using the conductive paste described herein. The electronic surface may be a conformable skin-like structure with large surface area, high mechanical flexibility and even stretchability, and multi-functional capabilities. Such structures will enable electroactive surfaces of arbitrary shape wrapped over airplane wings, buildings, robots, three-dimensional (3-D) displays, and human medical prostheses.

In a further aspect, the present invention provides an airplane wing, building, robot, three-dimensional display, robotic sensory skin, wearable communication device, bio-integrated device or human prosthesis comprising the electronic surface described herein.

In a further aspect, the present invention provides the use of the conductive paste described herein in a thermoforming method, a cold drawing method, the formation of 3D objects, SMT component mounting, screen printing, jet printing, the printing of lines having a thickness of 50 microns or more, a method of reducing CTE mismatch (for example, in a direct chip on board heat sink die attach for LED), LED lighting luminaire fabrication, a method of forming strain absorbing interconnects for high thermal cycle fatigue resistance and multi-step printing. When the paste is used in a printing method, it can print lines of 50 micron lines or less. Any shape may be printed, and multi-step printing is possible. LED lighting luminaire fabrication may be carried out with integrated thermal and electrical interconnect at very low cost The invention will now be described in relation to the following non-limiting examples.

Example 1

An organic medium for the composition of the invention was prepared as follows: to 170 grams of magnetically stirred carbitol acetate (boiling point 230° C.) and 40 g downol EPI-1 (from Dow Chemicals) were added 15 grams of Dynapol L411 (a linear aromatic polyester resin). Rheology modifier and adhesion promoter were added to the mixture. The mixture was heated to 60° C. and stirred at this temperature until a clear solution was obtained (after approximately 4 hours). The solution was allowed to cool slowly to ambient temperature.

To the above mixture, 650 parts by weight (65% by weight) of a flaky silver powder with predominant particle size in the range from about 1 to 20 microns and an average major particle diameter of 5 μm blended and dispersed uniformly by a mixing and grinding machine to obtain an electro conductive paste.

The viscosity of the resultant paste after 24 hour ambient temperature rest measured about 18,000 centipoise (at 20° C.) on a Brookfield RVT viscometer (5 rpm, No. 5 spindle). The resultant paste composition was printed on a 100 micron thick electrical grade PET film through 0.5 mil silk screen. The printed parts were dried in a laboratory air circulating oven at 120° C. for ten minutes to form a conductive interconnects. The resulting printed and dried element was tested for resistivity, adhesion (using cellophane tape sold as Scotch brand, #810), scratch resistance and stretching. Resistivity was measured using a four point probe method and standard multimeter. The conductive element was measured for resistivity, then folded in against itself and out against itself so as to create a crease perpendicular to a conductor line. Resistivity was then re-measured. Adhesion was measured with the switching element on a hard flat surface, and a two inch length of Scotch brand, #810 tape placed over approximately one inch of the printed conductor pattern. Smoothing pressure was applied with the fingers to insure good bonding of the tape adhesive to the conductive element, then peeled back in an upward motion and checked for evidence of conductor transfer. The fingernail scratch test was performed with the conductive element on a hard, flat surface. The element was scratched several times with the fingernail at moderate pressure perpendicular to the printed conductor pattern and checked for evidence of conductor removal. Stretch test was performed using bench vice (medium bench vice from McMaster). The printed substrate was fixed at both ends of the vice. The area to be tested was marked. Typically marking was 5 cm long. The test area was heated using an air gun at 150° C. and held for 60 seconds. The temperature was selected based on the glass transition temperature of the substrate. Typically stretching was done at 10° C. above the glass transition temperature of the substrate. The fixed printed substrate was slowly stretched to approx. 7 cm, i.e. 140% of the original length. It was cooled and analyzed under the microscope at 50× for any cracks. The results observed are set forth in the following Table 1, which indicate that for the amount of silver present, extremely high conductivity (low resistivity) was exhibited, indicating excellent conductivity efficiency provided by the resin. In addition, the data of Table 1 indicate that the conductive element exhibited very good adhesion, flexibility, very good scratch resistance, good pencil hardness and acceptable resistivity after stretching and bending. 3D objects are typically fabricated using cold drawing technology. In the laboratory set-up, JT-18 vacuum forming machine was used to fabricate 3D structures. Plastic film was heated above its glass transition temperature and thermoformed using rectangular die to create non-planar structures. These structures were analysed under microscope for any cracks. Resistivity and all other properties mentioned above were tested.

TABLE 1

Test results

| Dry coating thickness Micron | Resistivity mΩ/sq/mil | Cellophone tape adhesion | Pencil hardness | 140% Stretching characteristics | Resistivity after stretching mΩ/sq/mil |
|---|---|---|---|---|---|
| 15 | 12 | Very good | 2 H | Cracking of line | 55 |

Example 2

An electro conductive paste was obtained by following the same process as in Example 1 except that following flux composition was used:

| Ingredients: | Part by weight: |
|---|---|
| Silver flakes | 65 |
| Carbitol acetate-solvent | 18.00 |
| Downol-solvent | 4.00 |
| Dynapol L411-binder | 1.30 |
| Setal VS60 (trademark of Nuplex)-binder | 08.60 |
| Rheology modifier | 2.50 |
| Adhesion promoter | 0.60 |

This composition contained polyester polyol.

Example 3

An electro conductive paste was obtained by following the same process as in Example 1 except that following flux composition was used:

| Ag flakes | 65.00 |
|---|---|
| Carbitol acetate | 18.90 |
| Thinner | 3.2 |
| Dynapol 411 | 2.60 |
| Setal_US_136_BB_157 (Trademark of Nuplex) | 7.20 |
| Rheology modifier | 3.10 |

This composition contained branched polyester and polyamine curing agent

Example 4

An electro conductive paste was obtained by following the same process as in Example 1 except that following flux composition was used:

| Ingredients: | Part by weight: |
|---|---|
| Carbitol acetate | 17.0 |
| Thinner | 4.0 |
| Dynapol L411 | 1.5 |
| Setal VS80 (trademark of Nuplex) | 5.7 |
| Setal_US_136_BB_157 (Trademark of Nuplex) | 1.4 |
| Rheology modifier | 5.40 |

This composition contained branched polyester polyol and elastomer for better stretchability.

Example 5

An electro conductive paste was obtained by following the same process as in Example 1 except that following flux composition was used:

| Ingredients: | Part by weight: |
|---|---|
| Butyl carbitol | 17.0 |
| Az NPG/HD | 4.0 |
| Dynapol L411 | 1.5 |
| Setal VS80 (trademark of Nuplex) | 5.7 |
| PMMA | 1.1 |
| Rheology modifier | 2.70 |
| BYK4510 | 3.0 |

This composition contained copolyester resin, branched polyester polyol and elastomer for better stretchability.

Example 6

An electroconductive paste was obtained by following the same process as in Example 1 except that following flux composition was used:

| Ingredients: | Part by weight: |
|---|---|
| Carbitol acetate | 18.0 |
| Thinner | 4.0 |
| Dynapol L411 | 1.5 |
| Setal VS80 (trademark of Nuplex) | 5.7 |
| PMMA (poly (methyl methacrylate) | 1.1 |
| Rheology modifier | 3.0 |

This composition contained branched polyester polyol and elastomer for better stretchability. Silver flakes content is increased.

Example 7

An electroconductive paste was obtained by following the same process as in Example 1 except that following flux composition was used:

| Ingredients: | Part by weight: |
|---|---|
| Carbitol acetate | 17.0 |
| Thinner | 4.0 |
| Copolyester (DIC chemicals product no. OD-X-2560) | 1.5 |
| Setal_US_136_BB_157 (Trademark of Nuplex) | 5.7 |
| PMMA | 1.1 |
| Conductive filler | 1.0 |
| Rheology modifier | 4.70 |

This composition contained conductive filler, branched polyester polyol and elastomer for better stretchability and conductivity.

Example 8

An electro conductive paste was obtained by following the same process as in Example 1 except that following flux composition was used:

| Ingredients: | Part by weight: |
|---|---|
| Carbitol acetate | 17.0 |
| Thinner | 4.4 |
| Dynapol L411 | 1.5 |
| Setal_US_136_BB_157 (Trademark of Nuplex) | 5.7 |
| Graphite | 1.0 |
| Rheology modifier | 5.40 |

This composition helps reduce silver migration.

Example 9

An electro conductive paste was obtained by following the same process as in Example 1 except that following flux composition was used:

| Ingredients: | Part by weight: |
|---|---|
| Carbitol acetate | 17.0 |
| Thinner | 4.4 |
| Dynapol L411 | 1.5 |
| Setal_US_136_BB_157 (Trademark of Nuplex) | 5.7 |
| Graphene | 1.0 |
| Rheology modifier | 5.40 |

This composition uses filler for better electrical continuity when stretched and thermoformed.

All compositions in Examples 2-9 were prepared using 65 parts by weight of silver flakes as prepared in accordance with Example 1. The paste compositions were screen printed and dried as discussed in Example 1 and properties tested. The results, which are summarized in Table 2, indicate that the best overall performance was obtained with a medium in which the resin was 25% of the total weight of the medium. Graphite and graphene addition significantly enhances tensile properties of the conductive printed lines.

TABLE 2

Summary Test Results

| Examples | Dry coating thickness Micron | Resistivity mΩ/sq/mil | Cellophone tape adhesion | Pencil hardness | 140 Stretching characteristics | Thermoforming | % Resistivity after stretching/forming mΩ/sq/mil |
|---|---|---|---|---|---|---|---|
| 2 | 16 | 12 | V good | 2 H | No cracks | Possible | 55 |
| 3 | 16 | 12 | V good | 2 H | No cracks | Possible | 55 |
| 4 | 16 | 15 | V good | 2 H | No cracks | Possible | 53 |
| 5 | 16 | 29 | V good | 2 H | No cracks | Possible | 60 |

TABLE 2-continued

Summary Test Results

| Examples | Dry coating thickness Micron | Resistivity mΩ/sq/mil | Cellophone tape adhesion | Pencil hardness | 140 Stretching characteristics | Thermoforming | % Resistivity after stretching/forming mΩ/sq/mil |
|---|---|---|---|---|---|---|---|
| 6 | 16 | 30 | V good | 2 H | No cracks | Possible | 85 |
| 7 | 16 | 30 | V good | 2 H | No cracks | Possible | 85 |
| 8 | 17 | 32 | V good | 2 H | No cracks | Possible | 95 |
| 9 | 17 | 34 | V good | 2 H | No cracks | Possible | 110 |

Example 10—Printing Evaluation

A thorough printing evaluation was conducted on the pastes. A DEK03xi automated printer was used for the evaluation. Other parameters used are given in Table 3.

| Printing parameters | |
|---|---|
| Test vehicle | PET film |
| Stencil | Mesh screen |
| Stencil thickness | <1 mil |
| Aperture size | 0.5mm × 152 mm and 1 mm × 152 mm |

The results of the study are as follows:

Print window optimization: print window optimization was carried out to identify the optimized printing window to achieve a defect free printing. A mesh screen with less than 1 mil thickness was used for this. The study was also conducted for conventional and other paste samples. Dense lines of printed paste of Example 8 are shown in FIG. 1. The print window for this paste was optimized at: Print Speed—200 mm/Sec, Pressure—15 Kg, Snap Off Speed—0.5 mm/Sec, Flood height: 3.5 mm, Printing process: Print and Flood. The parameters show that the paste of Example 8 is able to print at high speed thus giving high throughput. It was observed that the paste does not compact post curing, thus aperture height is a vital factor to be considered for paste deposit thickness. The reason for the non-compactness of the paste is that it contains micron size flakes and, unlike nano-sized silver powder, there is no sintering phenomenon or grain boundary diffusion.

Figure 2:
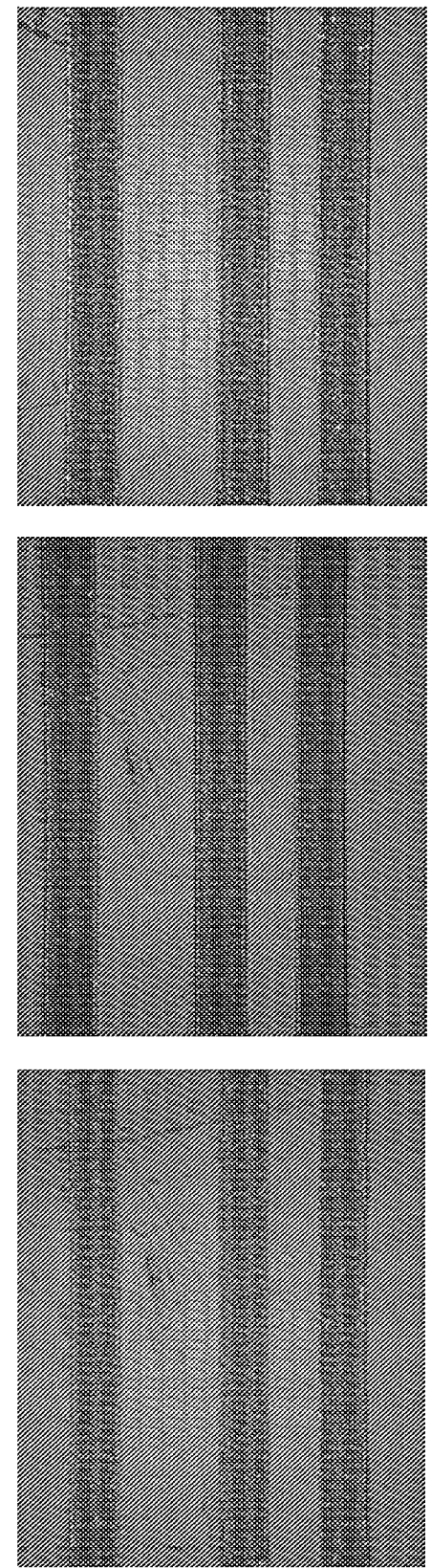
FIG. 2 shows lines of printed conductive paste according to the present invention after various lengths of time.

Response to pause: PET films were printed with paste fresh out of the jar (paste not kneaded). This provides a means of quantifying "out of jar performance". The test seeks to capture the initial performance by inspecting print deposits. The response to pause test provides information on how the paste responds to a pause in printing at different pause intervals. All example pastes yielded good response to pause test. In all cases, no bridges or bleeding was observed. Print definition was uniform and dense in all cases. This can be seen, for example, in FIG. 2, which shows printing images of the paste of Example 2 at t=0 (left hand side), t=60 minutes (middle) and t=120 minutes (right hand side).

Figure 3:
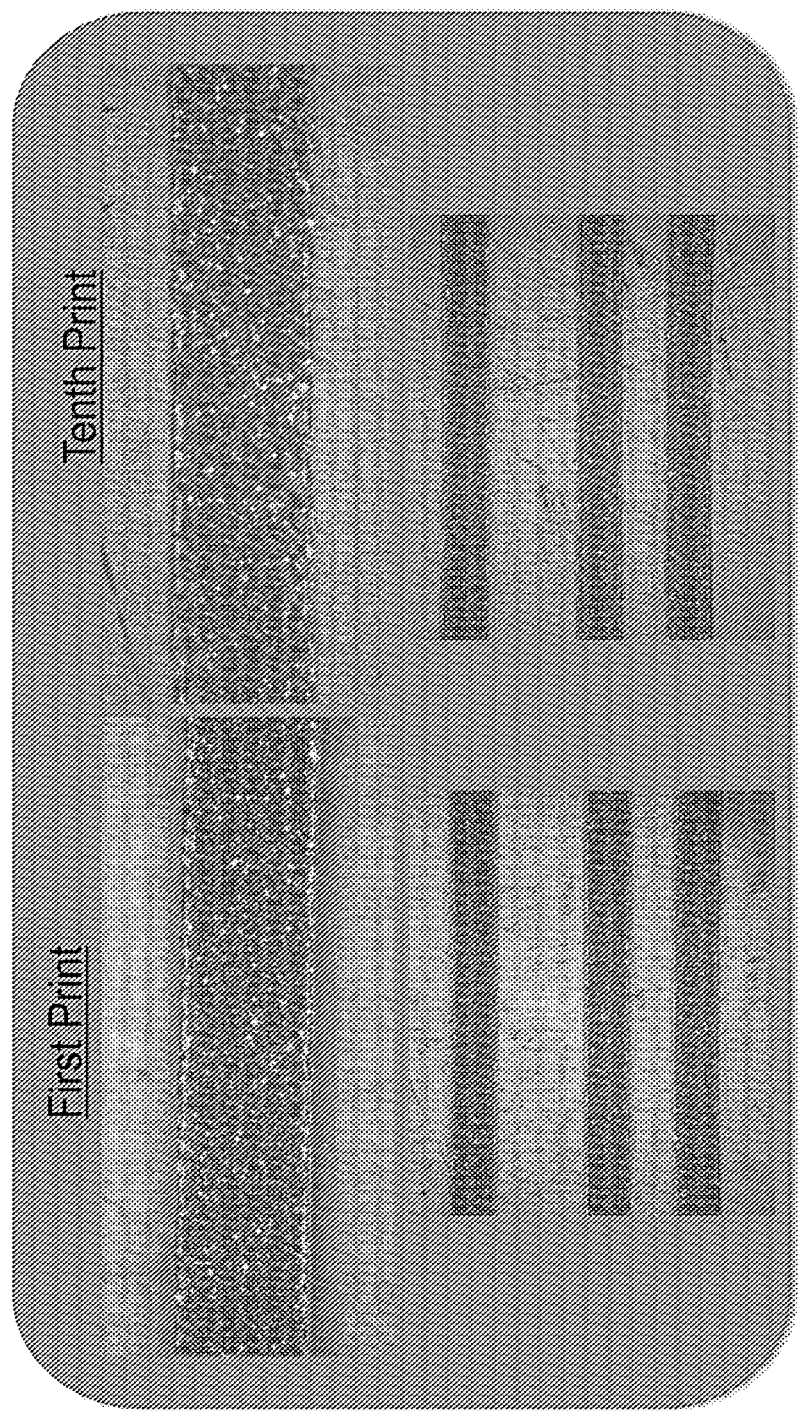
FIG. 3 shows the first and tenth print of a printing process using a conductive paste according to the present invention.

Continuous Print: This test was performed to determine the drying effect of paste in the aperture after every print, without flooding the paste on stencil. The test is important as it gives direct indication of throughput and material loss. Pastes in this invention were able to give 10 prints without flooding. All conventional commercial pastes severely failed in this application. The texture of the pastes of the present invention was smooth and the printed structures do not have any porosity. Without being bound by theory, it is considered that this is due to the solvent/binder of the pastes of the present invention. The possibility of continuous printing is also due to the novel solvent and rheology modifiers incorporated into the pastes. FIG. 3 shows the printing performance of the paste of Example 5. Dense lines with no defects were observed even after the $10^{th}$ print. The paste requires no flooding which is unique. All other commercial pastes cannot be printed without flooding.

Stencil life: In order to determine the stencil life of the paste, it was kneaded continuously at 25° C. Brookfield viscosity measurements were taken every hour including T-0. The sample was also printed at TO and at the end of the test in order to quantify printability and to track any changes in the paste's behavior over a period. This test gives an idea of how the paste performs on the stencil when kept open for a long time or run continuously for a longer time. All example pastes in this disclosure showed excellent performance in this test. They have a stencil life for four hours or more. No bubbling or abnormality in printing observed. The printed paste has a smooth structure on the substrate and a stencil life up to four hours. All pastes performed well throughout four hours of stencil life. No sticking to squeegee was observed. Good rolling was observed throughout four hours of kneading All example pastes performed well in all printing tests. Conventional paste was inferior in continuous printing. Table 4 gives a summary of the results of the printing study.

TABLE 4

Comparison of printing performance of all pastes

| Test | Properties of paste composition in this invention |
|---|---|
| Print window optimization | Mesh Screen Speed : 200 mm/sec Pressure: 13.5 kg Print and Flood |
| Response to pause | Upton 2 hr |
| No. of prints without flooding (Wipe frequency) | 10 |
| Ambient Temperature Viscosity Behavior | @ 0.5 RPM-450% increase @ 5. 0RPM-396% increase |
| Stencil Life Test | Stencil life Upton 4 hrs |

Example 11—Thermoforming

Thermoforming is a process in which a flat thermoplastic sheet is heated and deformed into the desired shape. Heating is usually accomplished by radiant electric heaters, located on one or both sides of the starting plastic sheet at a distance of roughly 125 mm (5 in.). The duration of the heating cycle needed to sufficiently soften the sheet depends on the polymer, its thickness and colour. The methods by which the forming step is accomplished can be classified into three basic categories: (1) vacuum thermoforming, (2) pressure thermoforming, and (3) mechanical thermoforming. In this investigation, vacuum thermoforming was used. Printed lines were thermoformed using specific mould designs. Line continuity, thermoformed object and overall performance of the paste was investigated.

Once printed, the substrate may undergo 3D deformation and the paste should be able to retain its conductivity and other physical properties without getting delaminated. The printed substrate may undergo cold drawing, thermoforming and similar 3D deformation activity in order to produce e.g. 3D components for stretchable electronic surfaces. The important objective of this work was to form a paste which should withstand such operations without losing physical properties such as conductivity or adhesion or getting lines cracked. In this study generally pastes were cured at 650° C. for 10 minutes in art air circulating oven. A variety of substrates were used for this study. Forming requires specific substrates for specific applications. While PET is common in industry, PMMA (Polymethyl methacrylate) and PC (Polycarbonate) are also sometimes used. All three substrates were used in this evaluation (see Table 5).

TABLE 5

Various substrates and their properties for vacuum forming.

| Base Material | Source | Thickness (μm) | Tg (° C.) | Ease of Forming |
|---|---|---|---|---|
| PET | Mc Master, USA | 100 | 86 | V. Difficult |
| APET (Vacuum Formable Grade) | Spearepet, India | 200 | 80 | Easy |
| Monocrystalline PET | Furukawa Electric, Japan | 1000 | 78 | V. Difficult |
| PMMA | Nudec, Spain | 1500 | 109 | Easy |
| Polycarbonate (PC) (Non UV coated) | Flexi Tuff, India | 1000 | 147 | Easy |

Figure 4:
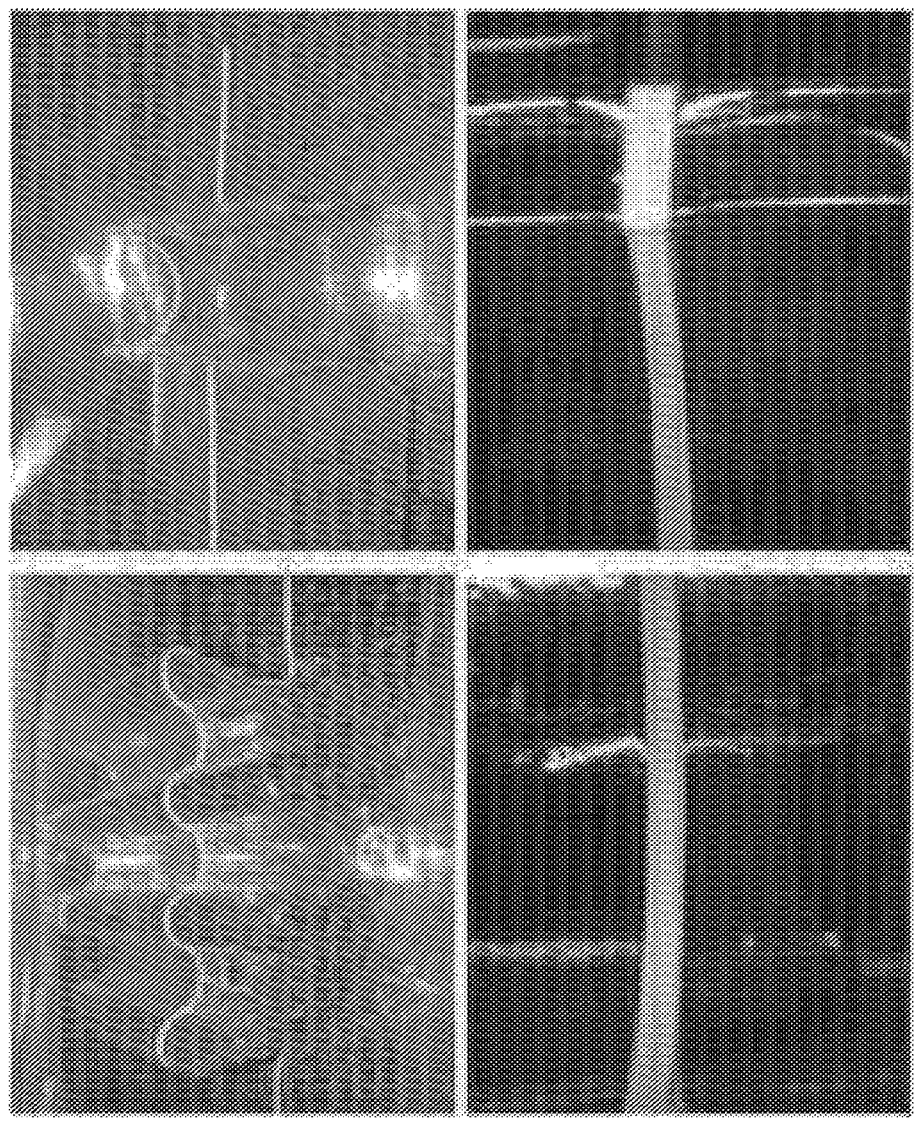
FIG. 4 shows a thermoformed substrate using conductive paste according to the present invention.
Figure 5:
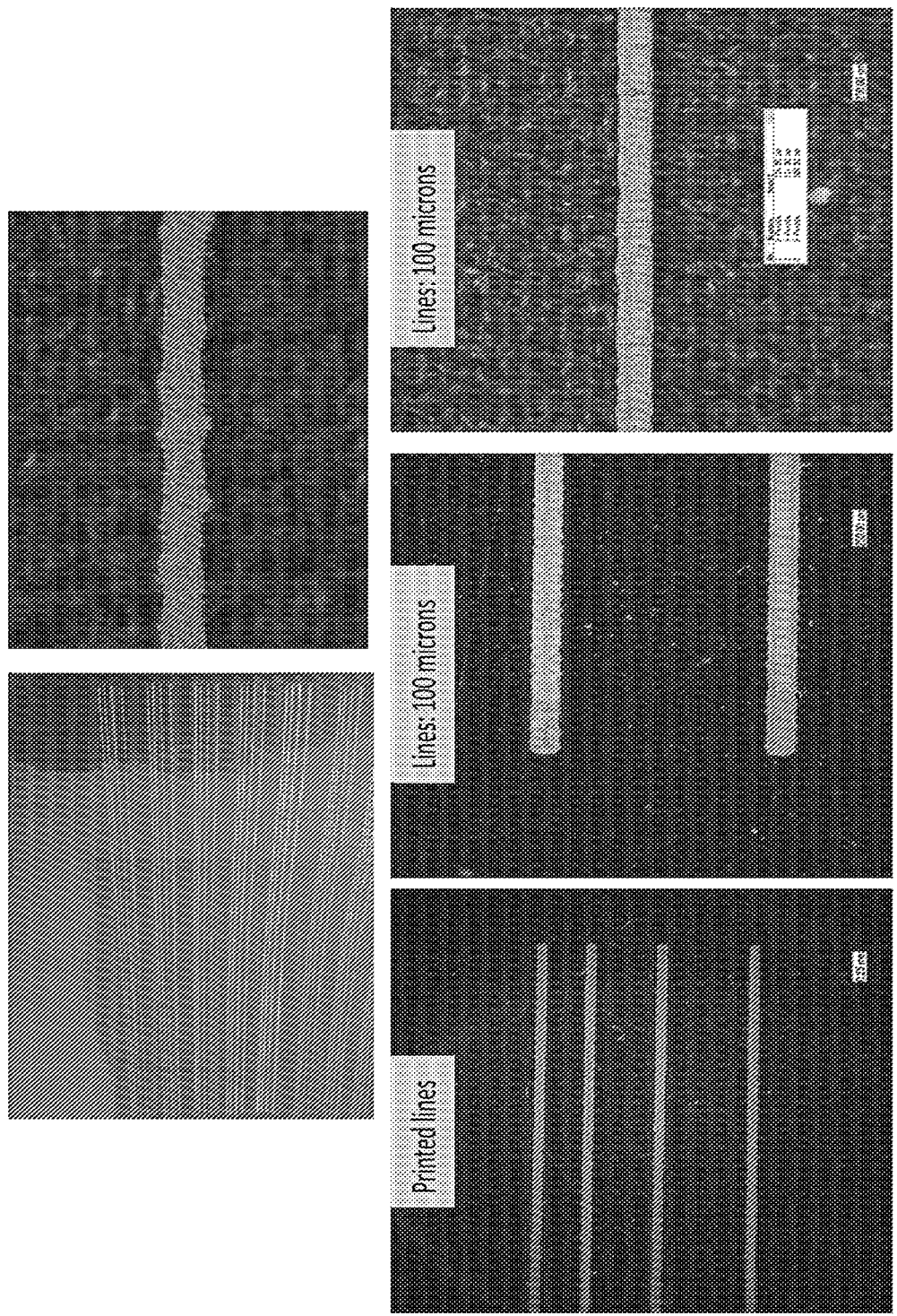
FIG. 5 shows a thermoformed substrate using conductive paste according to the present invention.
Figure 6:
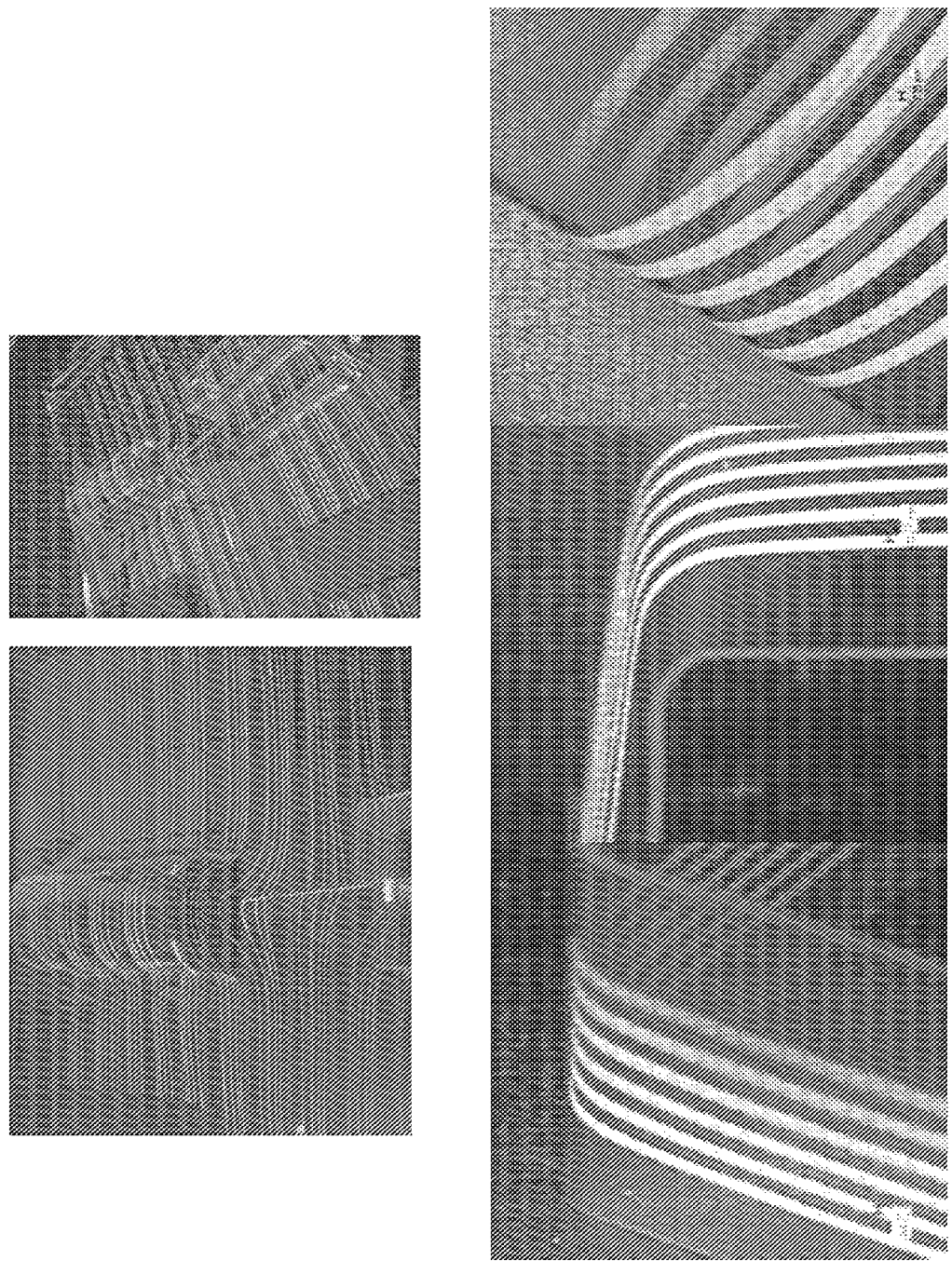
FIG. 6 shows a thermoformed substrate using conductive paste according to the present invention.

As stated above, PET is widely used substrate. This substrate thermoforms at around 120-125° C. Various molds were custom made for the thermoforming study. All example paste compositions showed excellent results on the PET substrate. FIGS. 4-6 show thermoformed substrates using the paste of Example 5. As can be revealed from microscopic images, no cracks were observed. The line was electrically continuous with a resistance of 55 ohm/sq. As shown in FIG. 5, lines could be printed with a thickness of 100 microns. As shown in FIG. 6, it was possible to achieve both 90° and 180° bends.

Example 12

Silver paste was prepared per example one, with the only difference being that copper coated silver powder was used as a starting point. The paste was dispensed on a plastic surface. It was dried and Alpha's low temperature solder paste, ALPHA CVP-520 (tin bismuth) paste was overprinted. On this assembly, SMT components were mounted and reflowed using standard reflow profile. The joints were inspected for voids and shear strength.

Similarly, using special stencils, LED assembly was mounted on this Ag paste/solder paste combination. In both examples, it was found that stretchable silver paste was capable of forming excellent solder joints and lighting LEDs with acceptable die shear strength.

Example 13

Silver paste was prepared per example one, with the only difference being that silver coated tin powder was used as a starting point. Similar results to that in Example 12 were obtained.

Example 14—Ag Paste as Conductive Adhesive ("Compliant" Paste)

Paste prepared similar to example one was dispensed using a manual pneumatic needle dispenser. The paste was dried at 65° C. One more layer of silver paste was overprinted on the cured Compliant trace. LEDs were assembled on this conductive traces and the entire assembly was cured at 120° C. in a convection oven for 30 minutes. No conductive adhesive was used.

LED glow was successfully observed and the measured die shear strength was 5 Kg. This confirms that compliant paste can act as a conductive adhesive and a polymer solder.

Example 15

Paste was prepared like example one, except for the fact that carbon (graphite) flakes were used as a starting point. The paste shows best in class stretchability and can be overprinted on silver traces to avoid silver migration and reduce cost.

The foregoing detailed description has been provided by way of explanation and illustration, and is not intended to limit the scope of the appended claims. Many variations in the presently preferred embodiments illustrated herein will be apparent to one of ordinary skill in the art and remain within the scope of the appended claims and their equivalents.

The invention claimed is:

1. A method of forming an interconnection between two work pieces to be joined, the method comprising:
   providing two or more work pieces to be joined;
   applying a conductive paste to at least one of the two or more work pieces to be joined;
   joining the two or more work pieces, wherein the conductive paste is between the two or more work pieces; and
   curing the conductive paste, wherein the conductive paste comprises: silver particles dispersed in an organic medium, the organic medium comprising: a solvent; and a binder comprising one or more polyesters, wherein the polyester exhibits one or more of the following properties: a specific gravity of from about 1.0 to 1.35, a viscosity of from about 800 to about 50,000 cPs, and softening point of less than 100° C., wherein the binder further comprises at least one of an elastomer and an amino resin.

2. A capacitive touchscreen panel comprising:
   a substrate; and
   a cured conductive paste adhered to the substrate, the cured conductive paste comprising: silver particles dispersed in an organic medium, the organic medium comprising: a binder comprising one or more polyesters, wherein the polyester exhibits one or more of the following properties: a specific gravity of from about 1.0 to 1.35, a viscosity of from about 800 to about 50,000 cPs, and softening point of less than 100° C., wherein the binder further comprises at least one of an elastomer and an amino resin.

3. A mobile telephone, laptop computer or tablet computer comprising the capacitive touchscreen panel of claim 2.

4. An electronic surface comprising:
a substrate; and
a cured conductive paste adhered to the substrate, the cured conductive paste comprising: silver particles dispersed in an organic medium, the organic medium comprising: a binder comprising one or more polyesters:
wherein a majority of the silver particles have a largest dimension of from 0.5 to 50 microns;
wherein the cured conductive paste comprises from 30 to 80 wt. % silver particles based on the total weight of the cured conductive paste;
wherein the one or more polyesters comprises a copolymer formed by copolymerization of an aromatic dicarboxylic acid and an alkylene glycol;
wherein the cured conductive paste comprises one or more additives selected from the group consisting of an elastomer, an amino resin, a rheology modifier, an adhesion promoter, a surface active agent, a silane monomer and/or silane oligomer, and a conductive polymer; and
wherein the cured conductive paste comprises one or more fillers comprising graphene and/or graphite.

5. The electronic surface according to claim 4, wherein the electronic surface is produced by thermoforming.

6. The method of claim 1, wherein at least one of the two or more work pieces to be joined is selected from the group consisting of a paper-phenolic resin board, a plastic board, and a glass epoxy resin board.

7. The method of claim 1, wherein the step of applying the conductive paste to at least one of the two or more work pieces to be joined comprises screen printing, stencil printing, and/or jetting.

8. The method of claim 1, wherein curing the conductive paste is carried out at a temperature of up to 250° C.

9. The method according to claim 1, wherein the solvent is selected from the group consisting of aromatics, ketones, esters, cellosolves, alcohols, phenols, butyl carbitol, acetates, ethers, and combinations thereof.

10. The method according to claim 1, wherein the elastomer further comprises an acrylic polymer obtained from monomers selected from the group consisting of alkyl methacrylate, alkyl acrylate, hydroxyalkyl acrylate, and hydroxyalkyl methacrylate.

11. The method according to claim 1, wherein the organic medium further comprises a copolymer selected from the group consisting of ethylene glycol, propylene glycol, an ester of adipic acid and neopentyl glycol, an ester of adipic acid, neopentyl glycol, 1,6-hexane diol, and combinations of one or more of the foregoing.

12. The method according to claim 8, wherein the conductive paste cures at a temperature between 3° and 120° C.

13. The method according to claim 1, wherein the conductive paste remains stable at room temperature for at least one year.

14. The method according to claim 1, further comprising the step of thermoforming or cold drawing the substrate with the conductive layer formed thereon.

15. The electronic surface according to claim 5, wherein the electronic surface is a conformable skin-like structure.

16. The electronic surface according to claim 15, wherein the conformable skin-like structure is capable of stretching up to 150% without substantial crack formation or substantial loss in electrical continuity.

* * * * *